(12) United States Patent
Lee et al.

(10) Patent No.: US 11,301,003 B2
(45) Date of Patent: Apr. 12, 2022

(54) ELETRONIC DEVICE WITH ANTI-SHOCK FUNCTION

(71) Applicant: GETAC TECHNOLOGY CORPORATION, Hsinchu County (TW)

(72) Inventors: Kun-Cheng Lee, Taipei (TW); Juei-Chi Chang, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 36 days.

(21) Appl. No.: 16/992,438

(22) Filed: Aug. 13, 2020

(65) Prior Publication Data

US 2021/0089088 A1 Mar. 25, 2021

Related U.S. Application Data

(60) Provisional application No. 62/904,967, filed on Sep. 24, 2019.

(51) Int. Cl.
| | |
|---|---|
| G06F 1/16 | (2006.01) |
| H01Q 1/22 | (2006.01) |
| H05K 5/02 | (2006.01) |
| H05K 5/06 | (2006.01) |
| H05K 5/00 | (2006.01) |
| H05K 5/04 | (2006.01) |
| E05D 3/02 | (2006.01) |
| E05D 5/04 | (2006.01) |
| F16C 11/04 | (2006.01) |

(52) U.S. Cl.
CPC ............ *G06F 1/1656* (2013.01); *E05D 3/02* (2013.01); *E05D 5/04* (2013.01); *F16C 11/04* (2013.01); *G06F 1/1654* (2013.01); *G06F 1/1679* (2013.01); *G06F 1/1683* (2013.01); *G06F 1/1698* (2013.01); *H01Q 1/2266* (2013.01); *H05K 5/0017* (2013.01); *H05K 5/0204* (2013.01); *H05K 5/04* (2013.01); *H05K 5/061* (2013.01); *H05K 5/069* (2013.01); *E05Y 2900/606* (2013.01); *G06F 1/1616* (2013.01)

(58) Field of Classification Search
CPC ..... G06F 1/1616; G06F 1/1656; G06F 1/1698
See application file for complete search history.

(56) References Cited

U.S. PATENT DOCUMENTS

| | | | | |
|---|---|---|---|---|
| 8,896,487 B2 * | 11/2014 | Chiang | ............... | H01Q 1/38 343/702 |
| 10,243,279 B2 * | 3/2019 | Liu | ............. | H01Q 1/24 |
| 10,347,965 B2 * | 7/2019 | Hawaka | ............... | H01Q 1/2266 |

(Continued)

*Primary Examiner* — Adrian S Wilson

(57) ABSTRACT

The present invention discloses an electronic device with an anti-shock function. The electronic device includes a device body, a buffer assembly and an antenna structure. An outer peripheral wall of the device body has a central region and a border region located on one side of the central region. The buffer assembly is disposed in the border region of the outer peripheral wall, and includes a buffer bracket and a protection casing disposed on an outer side of the buffer bracket. The antenna structure is disposed on the buffer bracket. Accordingly, the electronic device with an anti-shock function of the present invention is provided with more space for configuring antennas.

13 Claims, 8 Drawing Sheets

(56) References Cited

U.S. PATENT DOCUMENTS

| | | | |
|---|---|---|---|
| 2004/0025993 A1* | 2/2004 | Russell | G06F 1/1613 |
| | | | 150/154 |
| 2009/0179806 A1* | 7/2009 | Ji | G06F 1/1616 |
| | | | 343/702 |
| 2011/0228457 A1* | 9/2011 | Moon | G06F 1/1632 |
| | | | 361/679.01 |
| 2013/0285516 A1* | 10/2013 | Mizoguchi | G06F 1/1637 |
| | | | 312/7.2 |
| 2018/0309185 A1* | 10/2018 | Akiyama | H01Q 1/2266 |
| 2018/0375189 A1* | 12/2018 | Hawaka | H01Q 1/2266 |

* cited by examiner

ELETRONIC DEVICE WITH ANTI-SHOCK FUNCTION

CROSS-REFERENCE TO RELATED APPLICATIONS

The present application claims the benefit of U.S. provisional Patent Application No. 62/904,967, filed on Sep. 24, 2019, the disclosure of which is hereby incorporated by reference herein in its entirety.

BACKGROUND OF THE INVENTION

Field of the Invention

The present invention relates to an electronic device, and more particularly to an electronic device with an anti-shock function.

Description of the Prior Art

With fast evolving technologies, computers are thoroughly infused in the lives of people, such that computers are omnipresent and have become indispensable necessities in the lives of the modern people. As laptop computers feature advantages of having a small volume, a light weight and easy portability compared to desktop computers, sales of laptop computers keep gradually increasing over the years.

The size of a screen provided for a laptop computer is much smaller than that for a desktop computer. Thus, given the gradual progress in manufacturing technologies for screens, screens of current laptop computers mostly adopt a high screen ratio design. However, under a high screen ratio structural design for laptop computers, the width of a screen in a non-display region has a distance of merely 4 mm to 6 mm, resulting in a significant decrease in available space for configuring antennas, in a way that the design of current laptop computer antennas fails to satisfy current needs.

Therefore, how to reinforce utilization performance of laptop computers by improving the structural design so as to overcome the foregoing issues remains an important task to be resolved by related industry.

SUMMARY OF THE INVENTION

The technical problem to be resolved by the present invention is how to provide an electronic device with an anti-shock function with respect to the prior art.

To resolve the above technical problem, a technical solution of the present invention provides an electronic device with an anti-shock function. The electronic device includes a device body, a buffer assembly and an antenna structure. An outer peripheral wall of the device body has a central region and a border region located on one side of the central region. The buffer assembly is disposed in the border region of the outer peripheral wall, and includes a buffer bracket and a protection casing disposed on an outer side of the buffer bracket. The antenna structure is disposed on the buffer bracket.

Further, the antenna structure is disposed around the buffer bracket.

Further, the electronic device with an anti-shock function further includes a holding structure, which is disposed in the central region of the outer peripheral wall.

Further, the buffer assembly further includes an elastic element, which is disposed on the protecting casing.

Further, the protection casing includes a base, a sidewall connected to the base, and a top cover connected to the sidewall. The base, the side wall and the top cover form in an enclosed manner an accommodating space for accommodating the buffer bracket. The elastic element is fixedly connected to the base and the sidewall.

Further, a gap is reserved between an inner surface of the sidewall and the buffer bracket.

Further, the sidewall includes a first extension portion, a second extension portion, and a bending portion connected between the first extension portion and the second extension portion. The extension direction of the first extension portion and the extension direction of the second extension portion form therebetween an included angle, which is equal to or more than 90 degrees and equal to or less than 120 degrees.

Further, the elastic element includes a first elastic pad and a second elastic pad. The position of the first elastic pad corresponds to the base of the protection casing, and the position of the second elastic pad corresponds to the sidewall of the protection casing.

Further, the second elastic pad at least covers a portion of the bending portion of the sidewall.

Further, the bending portion of the sidewall includes a first fitting fastening structure, the second elastic pad includes at least one second fitting fastening structure, and the at least one first fitting fastening structure and the at least one second fitting fastening structure are fittingly fastened with each other.

Further, the second extension portion of the sidewall has a lock hole.

Further, the second extension portion of the sidewall has a thread groove, and the position of the thread groove corresponds to the lock hole.

One of the benefits of the present invention is that, the electronic device with an anti-shock function of the present invention is capable of enhancing the capability of withstanding impact of an external force by the technical solution "the buffer assembly is disposed in a border region of an outer peripheral wall of the device body, and includes a buffer bracket and a protection casing disposed on an outer side of the buffer bracket, and an antenna structure is disposed on the buffer bracket". On the other hand, given that the volume of the device is not increased, more space of configuring antennas is provided, thereby reinforcing the wireless communication function of the electronic device.

Detailed description and drawings of the present invention are given below for further understanding the features and technical contents of the present invention. However, the provided drawings are merely for reference and illustration purposes, and are not to be construed as limitations to the present invention.

DETAILED DESCRIPTION OF THE EMBODIMENTS

Specific embodiments are given below to describe implementation forms of "an electronic device with an anti-shock function" disclosed by the present invention. On the basis of the disclosure of the description, a person skilled in the art can understand the advantages and effects of the present application. The present invention can be implemented or applied by other specific embodiments, and various details given in the description of the present application can also be modified and changed based on different perspectives and applications without departing from the concepts of the present invention. Further, the drawings of the present invention are for brief illustration purposes and are not drawn to actual sizes and scales. Technical contents related to the present invention are further given in detail in the embodiments below; however, the disclosure is not to be construed as limitation to the protection scope of the present invention.

It should be understood that, terms including "first", "second" and "third" may be used in the disclosure to describe various elements; however, such elements not to be limited by these terms that are primarily for distinguishing one element from another element. Further, the term "or" used in the disclosure may include any one or more combinations of related listed items.

First Embodiment

Figure 1:
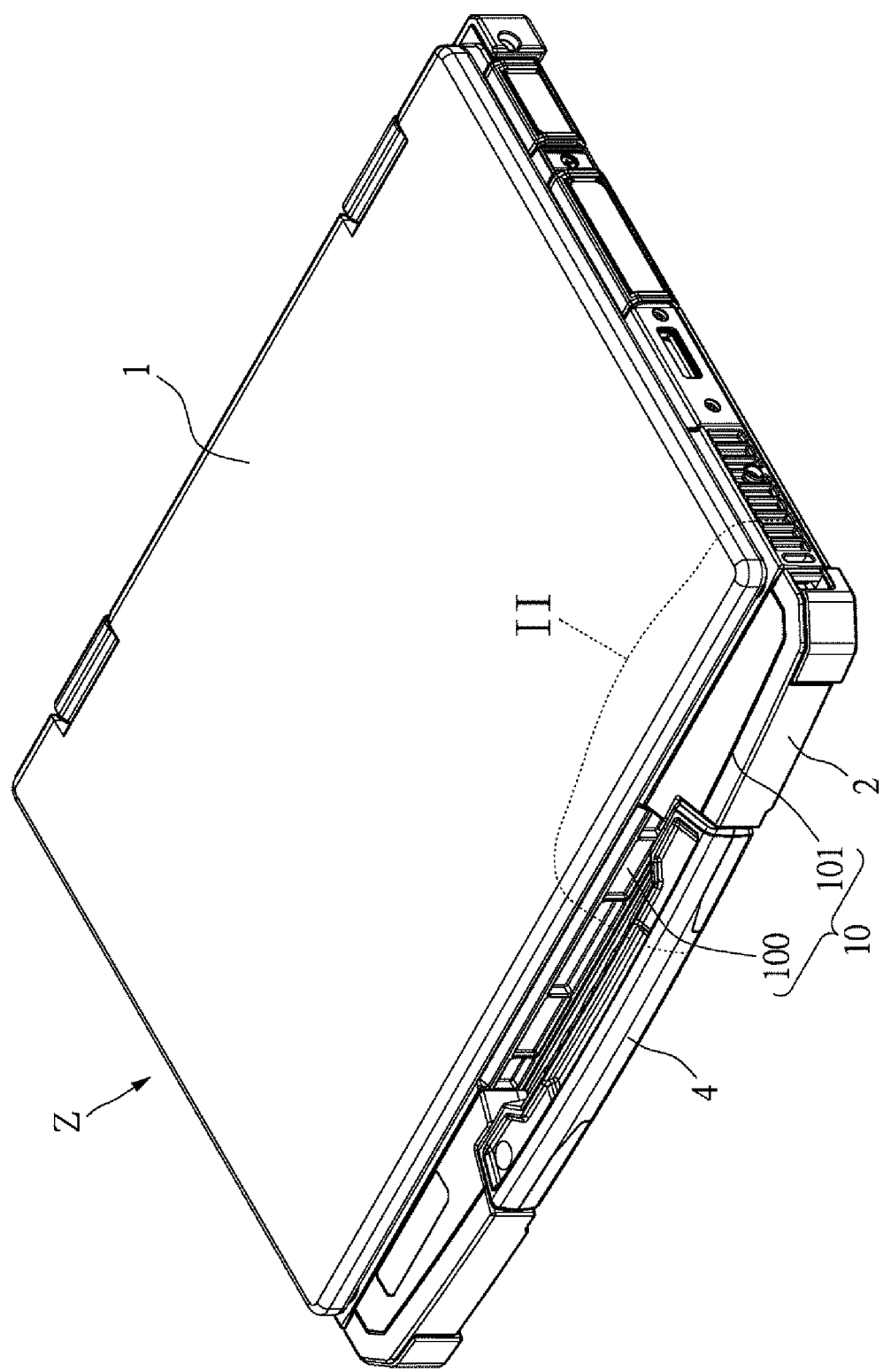
FIG. 1 is a three-dimensional schematic diagram of an electronic device with an anti-shock function according to a first embodiment of the present invention.
Figure 2:
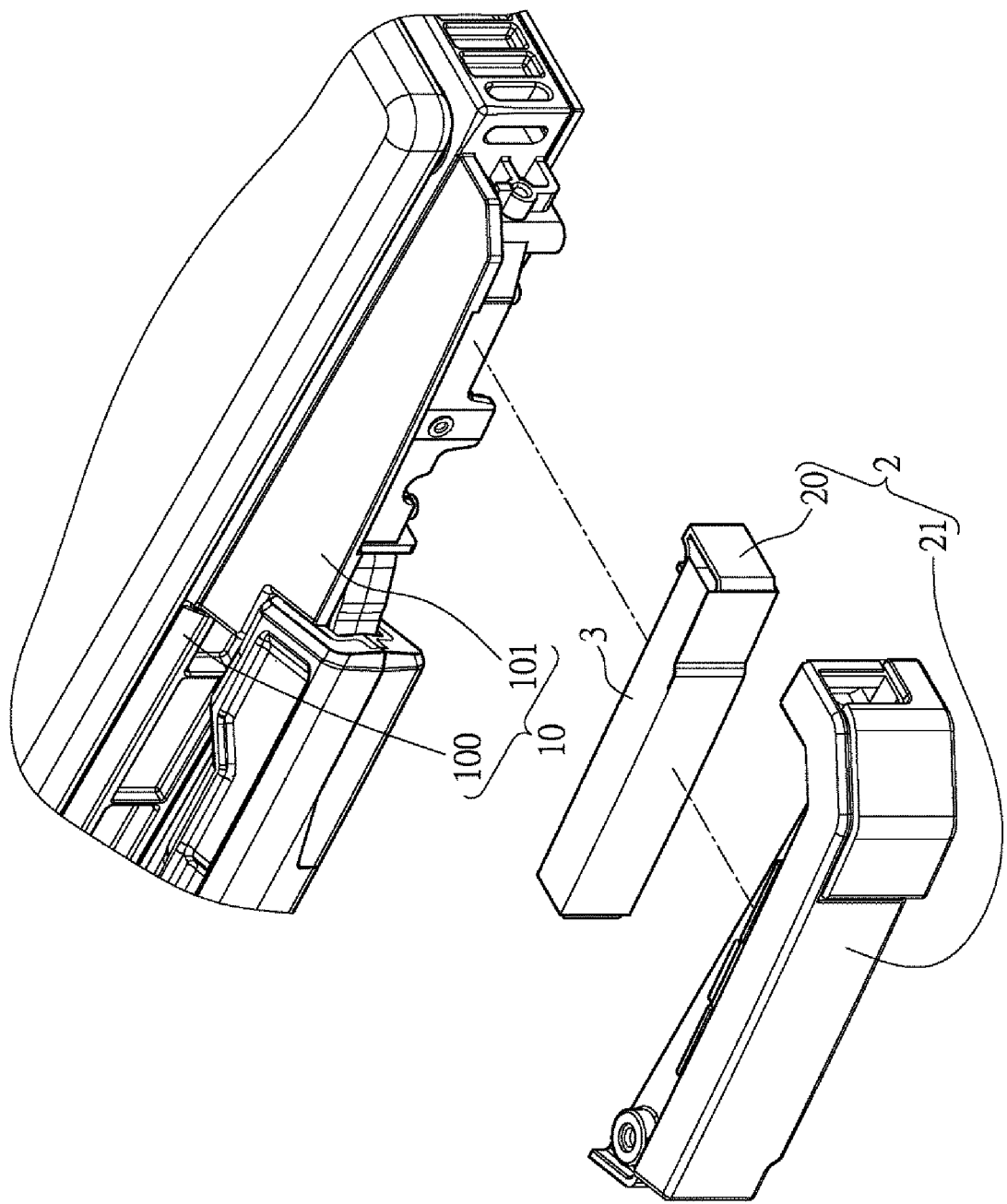
FIG. 2 is an enlarged schematic diagram of part II in FIG. 1.

Refer to FIG. 1 and FIG. 2 showing an entire and a portion of an electronic device with an anti-shock function according to a first embodiment of the present invention. As shown, the electronic device Z with an anti-shock function of the present invention primarily includes a device body 1, a buffer assembly 2 and an antenna structure 3. An outer peripheral wall 10 of the device body 1 has a central region 100 and a border region 101 located on one side of the central region 100. The buffer assembly 2 is disposed in the border region 101 of the outer peripheral wall 10, and includes a buffer bracket 20 and a protection casing 21 disposed on an outer side of the buffer bracket 20. The antenna structure 3 is disposed on the buffer bracket 20.

In practice, the device body 1 can be a host of a laptop computer, and includes a processor and multiple electronic components. Further, the device body 1 may be used in coordination with a display screen (not shown), which is for displaying dynamic or still images. However, the above example is a feasible implementation form of the present invention and is not to be construed as a limitation to the present invention. It should be noted that, the electronic device Z of the present invention integrates two functional (that is, anti-shock and communication functions) components that occupy physical volumes, and thus provides more effective space for configuring antennas without increasing the device volume.

In this embodiment, the outer peripheral wall 10 of the device body 1 may has two border regions 101 respectively located on two opposite sides of the central region 100, wherein the two border regions 101 are located close to the central region 100. Further, the number of the buffer assembly 2 may also be two, and the two buffer assemblies 2 are respectively disposed in the two border regions 101; however, the present invention is not limited to the above examples. Further, each buffer assembly 2 is disposed detachably in the corresponding border region 101, so as to provide more flexible and convenient use. The protection casing 21 covers the buffer bracket 20 from the front, and the protection casing 21 and the buffer casing 20 are capable of jointly withstanding the impact of an external fore. Further, the antenna structure 3 is disposed around the buffer bracket 20, and is similarly covered and hence protected by the protection casing 21; however, the present invention is not limited to the above example.

In practice, the buffer bracket 20 and the protection casing 21 of the buffer assembly 2 may be made of a plastic material, and the antenna structure 3 may be an antenna structure made of a flexible printed circuit board (FPC). The number of the antenna structure 3 may be only one, and the one antenna structure 3 is disposed on the buffer bracket 20 of one of the buffer assemblies 2. Alternatively, the number of the antenna structure 3 may be two, and the two antenna structures 3 are respectively disposed on the buffer brackets 20 of the two buffer assemblies 2.

It should be noted that, in the presence of the buffer assembly 2, the electronic device Z of the present invention is prevented from severe damage or malfunction, even if accidentally fallen from a high place or impacted by an intense external force during use. That is to say, the buffer assembly 2 is capable of buffering the stress received by the electronic device Z, hence ensuring normal operations of the electronic device Z. Accordingly, the electronic device Z of the present invention conforms to "military specifications".

Again referring to FIG. 1, the electronic device Z of the present invention further includes a holding structure 4, which may be disposed in the central region 100 of the outer peripheral wall 10, that is, disposed between the two buffer assemblies 2, thereby enabling a user to manually carry the electronic device Z. Although the holding structure 4 is exemplified by a handle in FIG. 1 and FIG. 2, it is in fact not limited by a specific form, given that a user is enabled to operate single-handedly.

In addition, in the electronic device Z of the present invention, the buffer assembly 2 is not limited to being disposed on the outer peripheral wall 10 (the front outer peripheral wall). In other words, according to actual requirements, the buffer assembly 2 may be disposed on other outer peripheral walls (for example, left, right or rear outer peripheral wall) of the device body 1.

Second Embodiment

Referring to FIG. 1 and FIG. 2, as well as FIG. 3 to FIG. 6, FIG. 3 to FIG. 6 respectively show one three-dimensional schematic diagram of a buffer assembly, another three-dimensional schematic diagram of a buffer assembly, and a section schematic diagram and a partial top schematic diagram of an electronic device with an anti-shock function according to a second embodiment of the present invention. The structure of the electronic device Z of this embodiment can be referred from the description of the first embodiment, and is omitted herein for brevity. It should be noted that, the buffer assembly 2 of the electronic device Z of this embodiment further includes an elastic element 22. The elastic element 22 is disposed on the protection housing 21, and the elastic element 22, the buffer bracket 20 and the protection casing 21 jointly withstand the impact of an external force, hence achieving better anti-shock performance.

Figure 3:
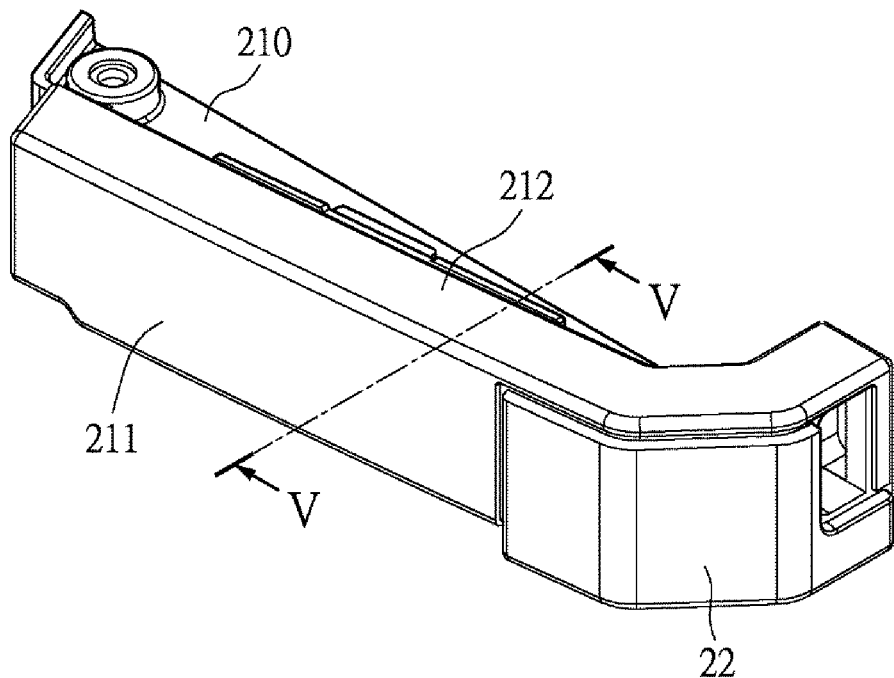
FIG. 3 is a first three-dimensional schematic diagram of a buffer assembly of an electronic device with an anti-shock function according to a second embodiment of the present invention.
Figure 4:
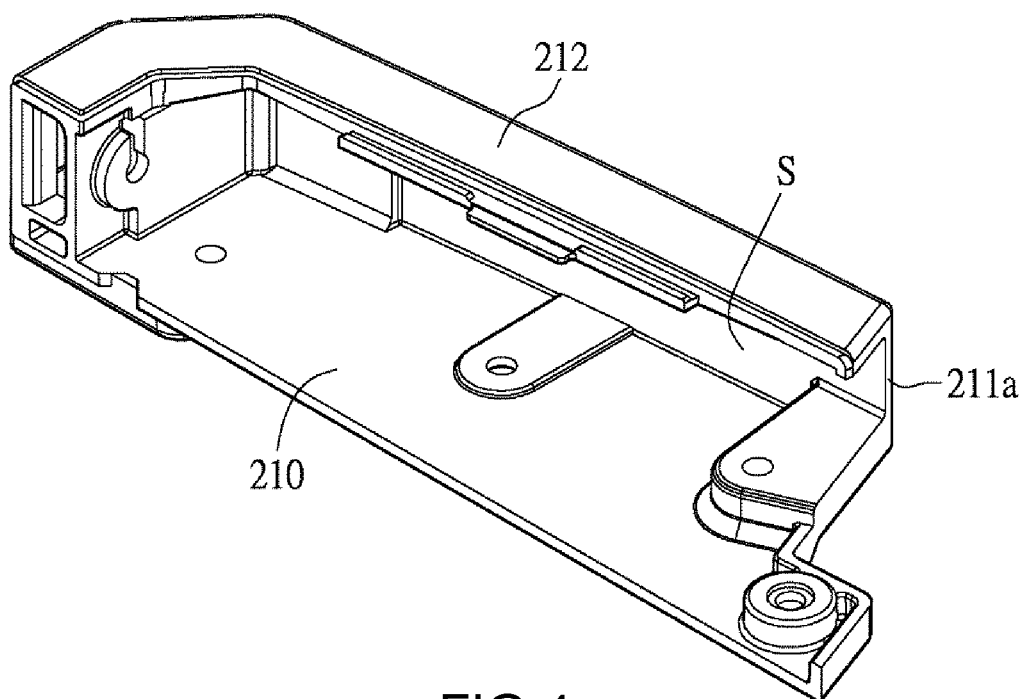
FIG. 4 is a second three-dimensional schematic diagram of a buffer assembly of an electronic device with an anti-shock function according to the second embodiment of the present invention.

In this embodiment, as shown in FIG. 3 and FIG. 4, the protection casing 21 includes a base 210, a sidewall 211 connected to the base 210, and a top cover 212 connected to the sidewall 211. The base 210, the sidewall 211 and the top cover 212 are integrally formed and jointly form in an enclosed manner an accommodating space S for accommodating the buffer bracket 20. In addition, the elastic element 22 is fixedly connected to the base 210 and the sidewall 211. Further, the base 210 and the top cover 212 are formed by extending from the bottom and the top of the sidewall 211, respectively, and the extension directions of the base 210 and the top cover 212 are substantially perpendicular to the extension direction of the sidewall 211; however, the present invention is not limited to the above examples. Further, elastic element 22 may be made of a rubber material, and may be detachably coupled on the protection casing 21 and cover a portion of the base 210 and a portion of the sidewall 211. However, the above examples are merely examples of feasible implementation forms of the present invention and are not to be construed as limitations to the present invention.

Figure 5:
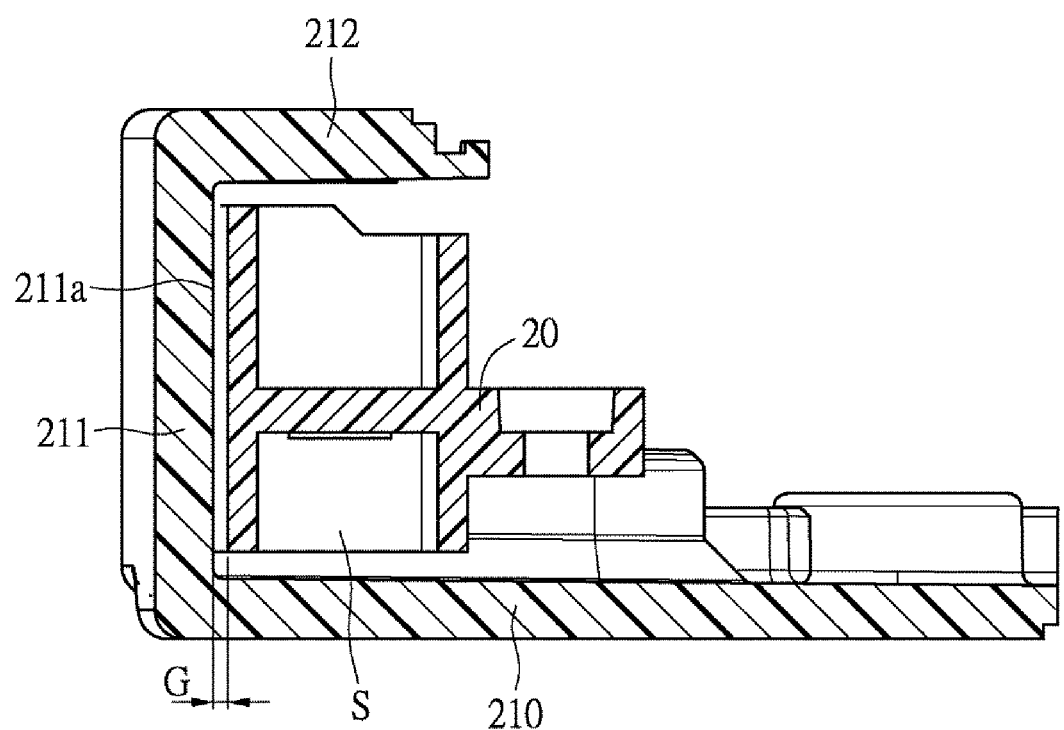
FIG. 5 is a section schematic diagram of part V-V in FIG. 3.

It should be noted that, as shown in FIG. 5, an appropriate gap G is reserved between an inner surface 211a of the sidewall 211 and the buffer bracket 20, so as to provide space for buffering and deformation of the protection casing 21. Accordingly, the buffer bracket 20 and the antenna structure 3 are prevented from being pressed when the protection casing 21 is deformed upon receiving an impact of an external force.

Figure 6:
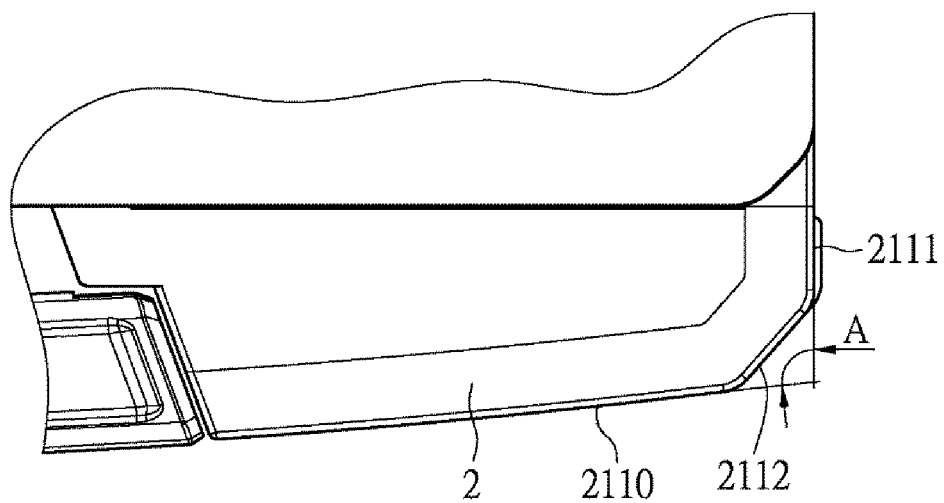
FIG. 6 is a partial top schematic diagram of an electronic device with an anti-shock function according to the second embodiment of the present invention.

Further, as shown in FIG. 6, the sidewall 211 includes a first extension portion 2110, a second extension portion 2111, and a bending portion 2112 connected between the first extension portion 2110 and the second extension portion 2111. The extension direction of the first extension portion 2110 and the extension direction of the second extension portion 2111 form therebetween an included angle A, which is equal to or more than 90 degrees and equal to or less than 135 degrees.

Third Embodiment

Figure 7:
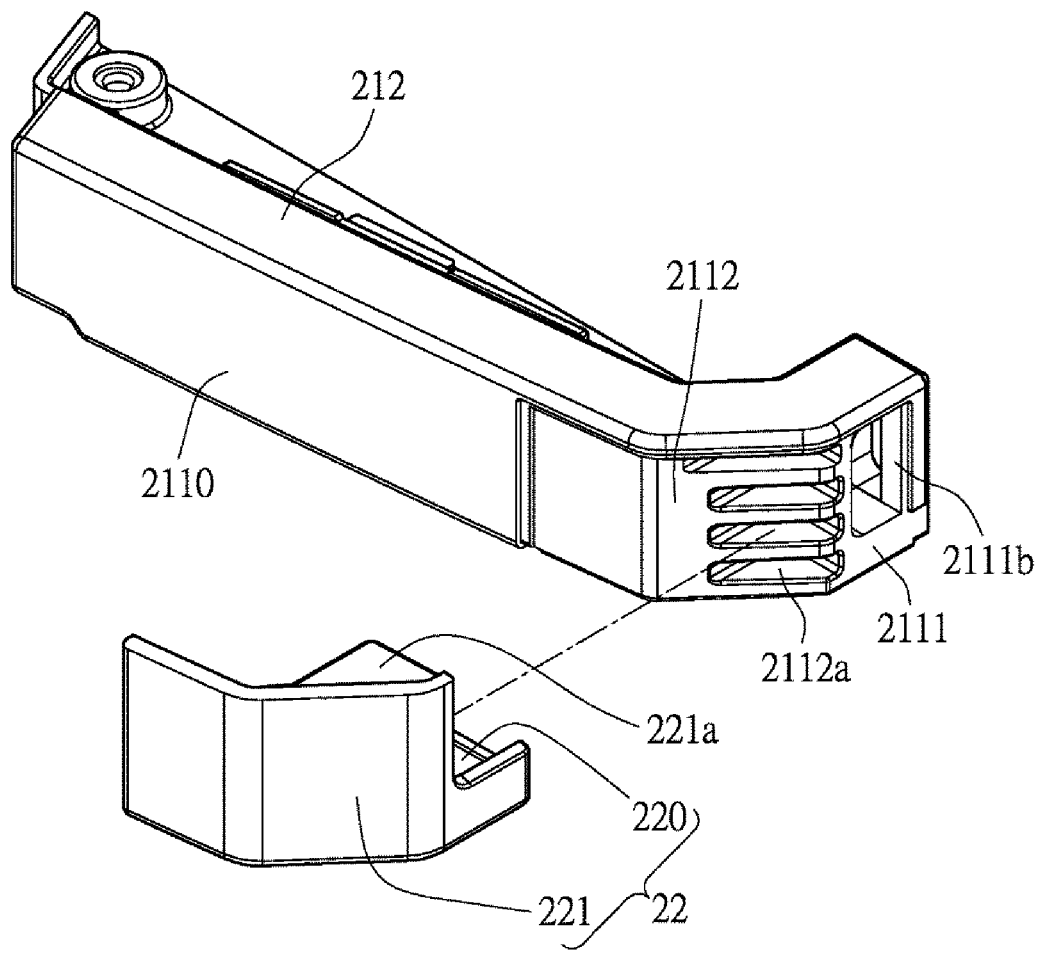
FIG. 7 is an exploded schematic diagram of an electronic device with an anti-shock function according to the second embodiment of the present invention.
Figure 8:
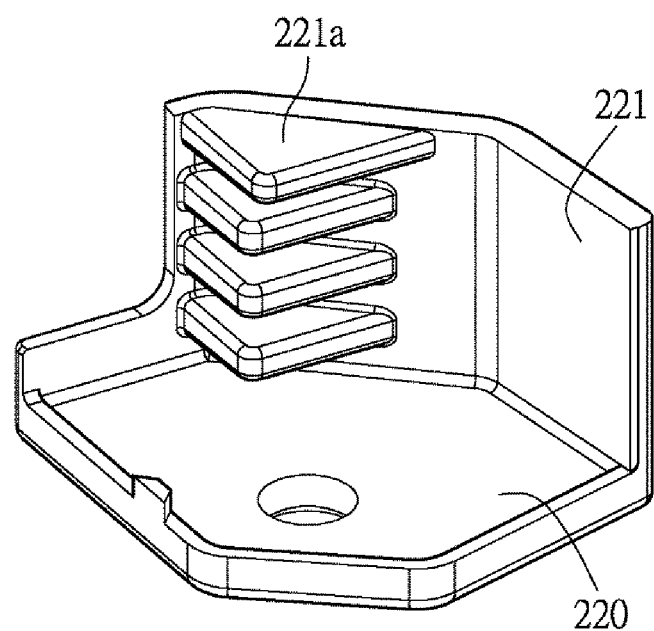
FIG. 8 is a three-dimensional schematic diagram of an elastic element of an electronic device with an anti-shock function according to the second embodiment of the present invention.
Figure 9:
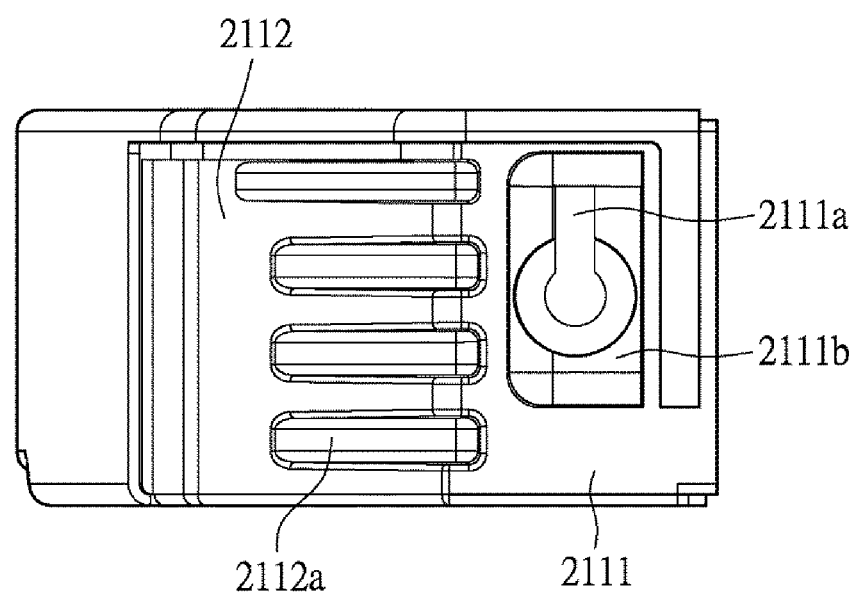
FIG. 9 is a side schematic diagram of a protection casing of an electronic device with an anti-shock function according to the second embodiment of the present invention.

Referring to FIG. 1 and FIG. 2, as well as FIG. 7 to FIG. 9, FIG. 7 to FIG. 9 respectively show an exploded schematic diagram of a buffer assembly, a three-dimensional schematic diagram of an elastic element, and a side schematic diagram of a protection casing of an electronic device with an anti-shock function according to a third embodiment of the present invention. The structure of the electronic device Z of this embodiment can be referred from the description of the first embodiment, and is omitted herein for brevity.

In this embodiment, as shown in FIG. 7 and FIG. 8, the elastic element 22 can include a first elastic pad 220 and a second elastic pad 221. The position of the first elastic pad 220 corresponds to the base 210 of the protection casing 21, the position of the second elastic pad 221 corresponds to the sidewall 211 of the protection casing 21, and the second elastic pad 221 at least covers a portion of the bending portion 2112 of the sidewall 211. Further, the first elastic pad 220 and the second elastic pad 221 are a formed integral, the first pad 220 provides an additional layer of elastic buffer protection on the base 210, and the second elastic pad 221 provides an additional layer of elastic buffer protection on the sidewall 211; however, the present invention is not limited to the above examples. It should be noted that, the above description is merely feasible implementation forms of the present invention, and is not to be construed as limitations to the present invention.

In practice, the bending portion 2112 of the sidewall 211 can include at least one first fitting fastening structure 2112a, the second elastic pad 221 can include at least one second fitting fastening structure 221a, and the at least one first fitting fastening structure 2112a and the at least one second fitting fastening structure 221a are fittingly fastened with each other. Further, referring to FIG. 7 and FIG. 8, the at least one first fitting fastening structure 2112a and the at least one second fitting fastening structure 221a can match each other. The first fitting fastening structure 2112a can be formed by recessing from an outer surface of the bending portion 2112, for example, as a slot; the second fitting fastening structure 221a can be formed by protruding from an inner surface of the second elastic pad 221, for example, as a protrusion. However, the above description is merely feasible implementation forms of the present invention, and is not to be construed as limitations to the present invention. Thus, by fittingly fastening the first fitting fastening structure 2112a and the second fitting fastening structure 221a with each other, the elastic element 22 can be stably coupled on the protection casing 21.

As shown in FIG. 9, the second extension portion 2111 of the sidewall 211 can have a lock hole 2111a, which achieves an anti-theft function when the electronic device Z is in use. Further, the second extension portion 2111 of the sidewall 211 can further have a thread groove 2111b, and the position of the thread groove 2111b can correspond to the lock hole 2111a. Accordingly, the user is enabled to carry or operate in a suspended manner the electronic device Z.

Effects of the Embodiments

One of the benefits of the present invention is that, the electronic device with an anti-shock function of the present invention is capable of enhancing the capability of withstanding the impact of an external force by the technical solution "the buffer assembly is disposed in a border region of an outer peripheral wall of the device body, and includes a buffer bracket and a protection casing disposed on an outer side of the buffer bracket, and an antenna structure is disposed on the buffer bracket". On the other hand, given that the volume of the device is not increased, more space of configuring antennas is provided, thereby reinforcing the wireless communication function of the electronic device.

Further, in the presence of the buffer assembly, because the buffer assembly is capable of effectively buffering stress received by the electronic device, the electronic device is prevented from severe damage or malfunction, even if accidentally fallen from a high place or impacted by an intense external force during use, hence ensuring normal operations of the electronic device.

Further, a space for buffering and deformation is reserved between the protection casing and the buffer bracket of the buffer assembly, such that the buffer bracket and the antenna structure are prevented from being pressed when the protection casing is deformed upon receiving an impact of an external force.

The above disclosure is merely preferred feasible embodiments of the present invention and is not to be construed as limitations to the claimed scope of the present invention. Therefore, any equivalent technical modifications made on the basis of the contents of the description and drawings of the present invention are to be encompassed within the claimed scope of the present invention.

What is claimed is:

1. An electronic device with an anti-shock function, the electronic device comprising:
   a device body, an outer peripheral a device body, an outer peripheral wall of the device body having a central region and a of the device body having a central region and a border region located on one side of the central region;
   a buffer assembly, disposed in the border region of the outer peripheral wall, the buffer assembly comprising a buffer bracket and a protection casing disposed on an outer side of the buffer bracket; and
   an antenna structure, disposed on the buffer bracket;
   wherein a sidewall of the protection casing comprises a first extension portion, a second extension portion, and a bending portion connected between the first extension portion and the second extension portion, and an extension direction of the first extension portion and an extension direction of the second extension portion form therebetween an included angle that is equal or more than 90 degrees and equal to or less than 120 degrees.

2. The electronic device with an anti-shock function according to claim 1, wherein the antenna structure is disposed around the buffer bracket.

3. The electronic device with an anti-shock function according to claim 1, further comprising:
   a handle, disposed in the central region of the outer peripheral wall.

4. The electronic device with an anti-shock function according to claim 1, wherein the buffer assembly further comprises an elastic element, and the elastic element is disposed on the protection casing.

5. An electronic device with an anti-shock function, the electronic device comprising:
   a device body, an outer peripheral of the device body having a central region and a border region located on one side of the central region;
   a buffer assembly, disposed in the border region of the outer peripheral wall, the buffer assembly comprising a buffer bracket and a protection casing disposed on an outer side of the buffer bracket; and
   an antenna structure, disposed on the buffer bracket;
   wherein the buffer assembly further comprises an elastic element, and the elastic element is disposed on the protection casing;
   wherein the protection casing comprises a base, a sidewall connected to the base, and a top cover connected to the sidewall, the base, the sidewall and the top cover form in an enclosed manner an accommodating space for accommodating the buffer bracket, and the elastic element is fixedly connected on the base and the sidewall; and
   wherein the sidewall comprises a first extension portion, a second extension portion, and a bending portion connected between the first extension portion and the second extension portion, and an extension direction of the first extension portion and an extension direction of the second extension portion form therebetween an included angle that is equal or more than 90 degrees and equal to or less than 120 degrees.

6. The electronic device with an anti-shock function according to claim 5, wherein a gap is reserved between an inner surface of the sidewall and the buffer bracket.

7. The electronic device with an anti-shock function according to claim 5, wherein the elastic element comprises a first elastic pad and a second elastic pad, a position of the first elastic pad corresponds to the base of the protection casing, and a position of the second elastic pad corresponds to the sidewall of the protection casing.

8. The electronic device with an anti-shock function according to claim 7, wherein the second elastic pad at least covers a portion of the bending portion of the sidewall.

9. The electronic device with an anti-shock function according to claim 8, wherein the bending portion of the sidewall comprises at least one first fitting fastening structure, the second elastic pad comprises at least one second fitting fastening structure, and the at least one first fitting fastening structure and the at least one second fitting fastening structure are fittingly fastened with each other.

10. The electronic device with an anti-shock function according to claim 5, wherein the second extension portion of the sidewall has a lock hole.

11. The electronic device with an anti-shock function according to claim 10, wherein the second extension portion of the sidewall has a thread groove, and a position of the thread groove corresponds to the lock hole.

12. The electronic device with an anti-shock function according to claim 5, wherein the antenna structure is disposed around the buffer bracket.

13. The electronic device with an anti-shock function according to claim 5, further comprising:
   a handle, disposed in the central region of the outer peripheral wall.

* * * * *

UNITED STATES PATENT AND TRADEMARK OFFICE
CERTIFICATE OF CORRECTION

| | |
|---|---|
| PATENT NO. | : 11,301,003 B2 |
| APPLICATION NO. | : 16/992438 |
| DATED | : April 12, 2022 |
| INVENTOR(S) | : Kun-Cheng Lee and Juei-Chi Chang |

Page 1 of 1

It is certified that error appears in the above-identified patent and that said Letters Patent is hereby corrected as shown below:

In the Claims

In Claim 1, Column 7, Lines 12-16, please amend "a device body, an outer peripheral a device body, an outer peripheral wall of the device body having a central region and a of the device body having a central region and a border region located on one side of the central region" to be "a device body, an outer peripheral wall of the device body having a central region and a border region located on one side of the central region".

Signed and Sealed this
Thirtieth Day of September, 2025

John A. Squires
*Director of the United States Patent and Trademark Office*